United States Patent
Li et al.

(10) Patent No.: US 8,163,589 B2
(45) Date of Patent: Apr. 24, 2012

(54) ACTIVE LAYER FOR SOLAR CELL AND THE MANUFACTURING METHOD MAKING THE SAME

(75) Inventors: Chung-Hua Li, Taipei City (TW); Jian-Ging Chen, Donggang Township, Pingtung County (TW)

(73) Assignee: Aurotek Corporation (TW)

( * ) Notice: Subject to any disclaimer, the term of this patent is extended or adjusted under 35 U.S.C. 154(b) by 217 days.

(21) Appl. No.: 12/588,467

(22) Filed: Oct. 16, 2009

(65) Prior Publication Data

US 2010/0035413 A1 Feb. 11, 2010

Related U.S. Application Data

(62) Division of application No. 11/331,181, filed on Jan. 13, 2006, now abandoned.

(30) Foreign Application Priority Data

Jan. 13, 2005 (TW) .............................. 94100969 A

(51) Int. Cl.
*H01L 21/00* (2006.01)
(52) U.S. Cl. ... 438/63; 136/250; 136/261; 257/E31.042; 427/75; 438/960; 977/780; 977/784; 977/893
(58) Field of Classification Search ............. 438/745, 438/63, 960; 257/E21.219, E31.042; 977/778, 977/780, 784, 893; 427/75; 136/250, 256, 136/261
See application file for complete search history.

(56) References Cited

U.S. PATENT DOCUMENTS

| | | | | |
|---|---|---|---|---|
| 4,510,195 A * | 4/1985 | Iida et al. | ........................ | 136/256 |
| 6,750,393 B2 * | 6/2004 | Wada et al. | .................... | 136/256 |
| 7,045,851 B2 * | 5/2006 | Black et al. | .................... | 257/315 |
| 7,825,037 B2 * | 11/2010 | Brueck et al. | ................. | 977/780 |
| 7,951,638 B1 * | 5/2011 | Yang | ................................ | 438/63 |
| 2004/0249006 A1 * | 12/2004 | Gleason et al. | ................. | 521/61 |
| 2009/0217967 A1 * | 9/2009 | Hovel et al. | .................... | 136/256 |
| 2011/0011794 A1 * | 1/2011 | Brueck et al. | ................. | 977/780 |
| 2011/0269364 A1 * | 11/2011 | Yoon | ................................ | 445/24 |

* cited by examiner

*Primary Examiner* — Mary Wilczewski
*Assistant Examiner* — Toniae Thomas
(74) *Attorney, Agent, or Firm* — Bacon & Thomas, PLLC

(57) ABSTRACT

A method for manufacturing an active layer of a solar cell is disclosed, the active layer manufactured including multiple micro cavities in sub-micrometer scale, which can increase the photoelectric conversion rate of a solar cell. The method comprises following steps: providing a substrate having multiple layers of nanospheres which are formed by the aggregated nanospheres; forming at least one silicon active layer to fill the inter-gap between the nanospheres and part of the surface of the substrate; and removing the nanospheres to form an active layer having plural micro cavities on the surface of the substrate. The present invention also provides a solar cell comprising: a substrate, an active layer, a transparent top-passivation, at least one front contact pad, and at least one back contact pad. The active layer locates on a surface of the substrate and has plural micro cavities whose diameter is less than one micrometer.

13 Claims, 4 Drawing Sheets

ACTIVE LAYER FOR SOLAR CELL AND THE MANUFACTURING METHOD MAKING THE SAME

This application is a Divisional of application Ser. No. 11/331,181 filed on Jan. 13, 2006, the entire disclosure of which is herein incorporated by reference.

BACKGROUND OF THE INVENTION

1. Field of the Invention

The present invention relates to a method for manufacturing an active layer of a solar cell, and, more particularly, to a method for manufacturing an active layer including multiple micro cavities in sub-micrometer scale which can increase the photoelectric conversion rate of a solar cell.

2. Description of Related Art

The conventional energy for human society such as uranium, natural gas, and petroleum will be used up in future decades. The scientists therefore pay lots efforts to develop alternative energy such as solar energy, wind energy, wave energy, and earth heat.

However, the application of wind energy, wave energy, or the earth heat is limited by the geometrical regions such as the neighborhood of volcano, or that of sea shore. Moreover, most equipment required for the application of wind energy, wave energy, and earth heat is huge. Hence, the solar energy with high convenience attracts scientists' attention.

So far, many materials are used in the solar cells. Without surprise, the photoelectric conversion rates of various materials differ a lot. Generally speaking, current solar cells can be categorized into three major styles, i.e. silicon series solar cells, III-V series solar cells, and II-VI series. The silicon series solar cells include solar cells made of single crystal silicon, poly silicon, and amorphous silicon matrix. The III-V series solar cells include solar cells made of gallium arsenide matrix, indium phosphide matrix, and gallium indium phosphide matrix. The II-VI solar cells include the solar cells made of cadmium selenide matrix, and or copper indium selenide matrix. The maximum photo electro conversion rates of the solar cells are: single crystal silicon 24.7%, poly silicon 19.8%, amorphous silicon 14.5%, gallium arsenide 25.7%, and copper indium selenide 18.8%, individually. In fact, the photoelectric conversion rate for the solar cells in laboratory can be about 30%. However, the photoelectric conversion rate for the commercial solar cells is lower than 20%. Hence, the photoelectric conversion rate for the commercial solar cells still needs to be improved. Currently, the commercial solar cells are mainly made of single crystal silicon or poly silicon since the cost for mass production is relative low and the photoelectric conversion rate is acceptable.

However, the price of the solar cells is still high since more than half of the cost of the solar cells is the cost of the silicon matrix. Hence, scientists try to find the new materials for solar cells and improve the manufacturing process to reduce the cost. So far, the most effective option for reducing the cost and increasing the photoelectric conversion rate is to increase the photo-absorption area of the solar cells (e.g. using nanorod as materials for photoreaction) or to increase the number of the projected photons (e.g. applying an antireflection layer). But the manufacturing process for the solar cells containing nanorod is very complicated. Many metal catalysts are required to facilitate the formation of nanorods. Therefore, the cost increases since many metal catalysts are required. Furthermore, the metal catalysts also act as impurities in the solar cells to interfere the migration of electrons in the solar cells. Of course, the photoelectric conversion rate decreases. On the other hand, the formation of anti-reflection layer needs complicated photomasks to shape the surface into a pyramid-form. Then deposition is introduced to form anti-reflection layer. All this complicate process increase the cost of solar cells a lot, lower down the yield, and is not suitable for mass production.

Therefore, it is desirable to provide a solar cell with improved photoelectric conversion rate and method for manufacturing the same to mitigate the aforementioned problems.

SUMMARY OF THE INVENTION

The present invention provides a method for forming an active layer having plural micro cavities. The method comprises following steps: providing a substrate having multiple layers of nanospheres, wherein the multiple layers are formed by the aggregated nanospheres; forming at least one silicon active layer to fill the inter-gap between the nanospheres and part of the surface of the substrate; and removing the nanospheres to form an active layer having plural micro cavities on the surface of the substrate.

The present invention also provides an electrode for a solar cell. The electrode for a solar cell of the present invention, comprises: a substrate; and an active layer locating on a surface of the substrate and having plural micro cavities, wherein the diameter of the micro cavity is less than one micrometer.

The present invention also provides a solar cell. The solar cell of the present invention comprises: a substrate, an active layer, a transparent top-passivation, at least one front contact pad, and at least one back contact pad. The active layer locates on a surface of the substrate. The active layer also has plural micro cavities. Moreover, the diameter of the micro cavity is less than one micrometer. The transparent top-passivation locates on a surface of the active layer. The front contact pad is electrically connected to the active layer, while the back contact pad is electrically connected to the substrate. Moreover, the front contact pad and the back contact pad are electrically connected to an external circuit.

The micro cavities of the active layer can greatly increase the surface area for the reaction for the incident photons. Hence, the photoelectric conversion rate can be increased. In addition, since the photoelectric conversion rate of the solar cell of the present invention is higher than that of the conventional solar cells, the anti-reflection layer (AR layer) is not necessary for the solar cells of the present invention. Hence, the solar cells of the present invention can be produced through simpler processes, and the cost for manufacturing the solar cells can thus be reduced.

The nanospheres used in the method of the present invention can be any nanosphere. Preferably, the nanospheres are silicon oxide nanospheres, ceramic nanospheres, polymethyl methacrylate (PMMA) nanospheres, titanium oxide nanospheres, or polystyrene nanospheres. The method of the present invention can optionally further include step (B1) annealing the silicon active layer after the silicon active layer is formed in step (B). The temperature of annealing is not limited. Preferably, the temperature of annealing silicon active layer is in a range from 700 to 900° C. The substrate of the present invention can be any substrate. Preferably, the substrate is P-type silicon substrate or N-type silicon substrate. Preferably, the substrate of the present invention can be made of single crystal silicon, poly silicon, amorphous silicon, gallium arsenide, indium phosphide, gallium indium phosphide, or copper indium selenide. The formation of the active layer on the substrate can be achieved through any adequate process. Preferably, the formation of the silicon active layer on the substrate is achieved through sputtering or metal organic chemical vapor deposition (MOCVD). The silicon active layer of the present invention can be made of any silicon. Preferably, the silicon active layer is made of single crystal silicon, poly silicon, or amorphous silicon. The nanospheres in the silicon active layer of the present invention can be removed through any solution. Preferably, the nanospheres in the silicon active layer of the present invention are removed by hydrofluoric acid, formic acid, butanone, or toluene. The method of the present invention can optionally further comprises step (D) forming at least one thin doping layer on the active layer after the active layer having plural micro cavities is formed in step (C). The formation of the thin doping layer on the active layer can be achieved by any process. Preferably, the formation of the thin doping layer on the active layer is achieved by vapor deposition or sputtering. The combination of the substrate and the thin doping layer is not limited. Preferably, as the substrate is N-type silicon substrate, and the thin doping layer is made of boron, gallium, magnesium, or as the substrate is P-type silicon substrate, and the thin doping layer is made of phosphine, asinine, sulfur, or oxygen. The method of the present invention can optionally further comprises step (E) annealing the thin doping layer, the active layer, and the substrate after the thin doping layer is formed on the active layer in step (D). The temperature for annealing thin doping layer is not limited. Preferably, the temperature for annealing thin doping layer is in a range from 700 to 900° C.

The electrode for a solar cell of the present invention can have an actively layer having plural micro cavities with any diameters. Preferably, the diameter of the micro cavity is less than one micrometer. More preferably, the diameter of the micro cavity is in a range from 150 nm to 450 nm. The substrate of the electrode for a solar cell of the present invention is not limited. Preferably, the substrate is made of single crystal silicon, poly silicon, amorphous silicon, gallium arsenide, indium phosphide, gallium indium phosphide, or copper indium selenide. More preferably, the substrate is P-type silicon substrate or N-type silicon substrate. The combination of the substrate and the active layer of the electrode for a solar cell of the present invention is not limited. Preferably, as the substrate is P-type silicon substrate, the active layer is made of N-type materials doped with VA or VIA elements, or as the substrate is N-type silicon substrate, the active layer is made of P-type materials doped with IIA or IIIA elements.

The solar cell of the present invention can optionally further comprises a bottom-passivation locating between the substrate and the back contact pad. The substrate of the present invention is not limited. Preferably, the substrate is made of single crystal silicon, poly silicon, amorphous silicon, gallium arsenide, indium phosphide, gallium indium phosphide, or copper indium selenide. More preferably, the substrate is P-type silicon substrate or N-type silicon substrate. The combination of the substrate and the active layer is not limited. Preferably, as the substrate is P-type silicon substrate, the active layer is made of N-type materials doped with VA or VIA elements, or as the substrate is N-type silicon substrate, the active layer is made of P-type materials doped with IIA or IIIA elements. Preferably, the diameter of the micro cavity in the active layer of the solar cell of the present invention is less than one micrometer. More preferably, the diameter of the micro cavity is in a range from 150 nm to 450 nm. The active layer of the solar cell of the present invention can be any silicon. Preferably, the silicon of the active layer is single crystal silicon, poly silicon, or amorphous silicon. Preferably, as the substrate is P-type silicon substrate, the active layer is made of N-type materials doped with VA or VIA elements, or as the substrate is N-type silicon substrate, the active layer is made of P-type materials doped with IIA or IIIA elements Other objects, advantages, and novel features of the invention will become more apparent from the following detailed description when taken in conjunction with the accompanying drawings.

DETAILED DESCRIPTION OF THE PREFERRED EMBODIMENT

Figure 1A:
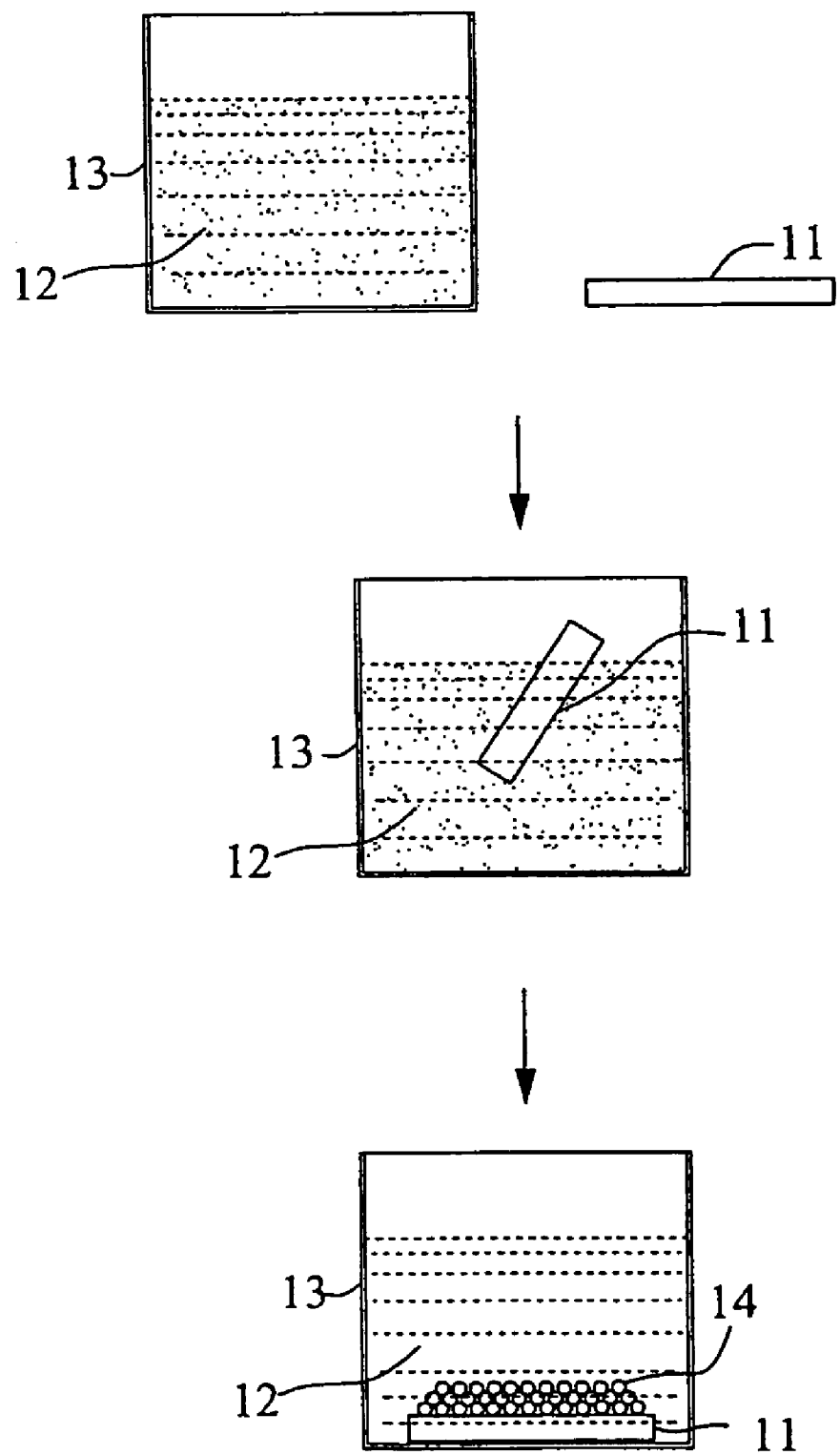
FIGS. 1a and 1b are figures showing the method of forming a substrate having multiple layers of nanospheres.
Figure 1B:
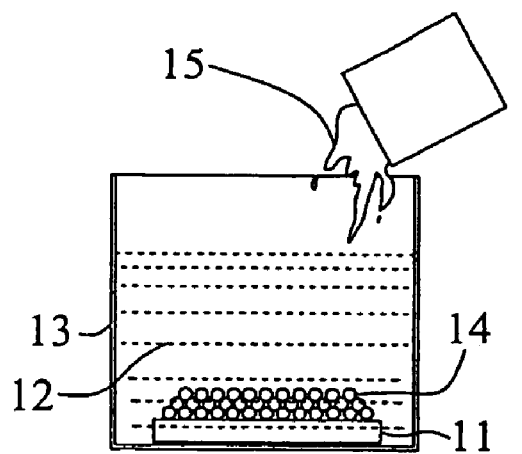
Figure 1B:
Figure 1B:
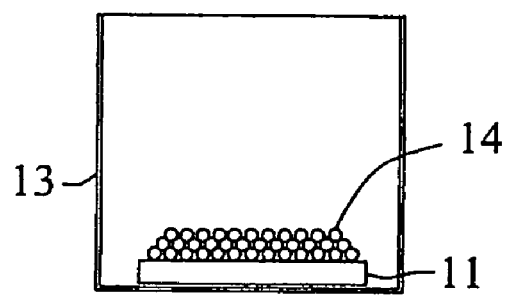
Figure 1B:
Figure 1B:
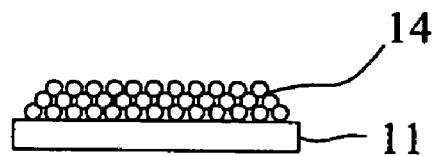

Since the manufacturing of the active layer with plural micro cavities of the present invention needs to use a mold plate having multiple layers of nanospheres on its surface. The mold plate having multiple layers of nanospheres can be prepared through the following process, as shown in the FIG. 1a and FIG. 1b.

At first, a molding-solution 12 and a P-type substrate 11 are provided. The molding-solution 12 used here comprises plural nanospheres and a surfactant. The P-type substrate 11 is put and immersed in the molding solution 12 in a container 13. Several minutes later, the nanospheres 14 aggregate on the surface of the P-type substrate 11 and assemble to form multiple layers of nanospheres on the surface of the substrate 11 automatically. The material of the nanospheres used here is silicon oxide (SiOx). The average diameter of the nanospheres used in the present embodiment is in a range from 150 nm to 450 nm.

However, the material of the nanospheres used in the invention is not limited to silicon oxide (SiOx). It is noticed that the material of the nanospheres is not limited. Preferably, the nanospheres can be made of poly methyl methacrylate (PMMA), polystyrene (PS), or titanium oxide (TiOx). Besides, the average diameter can be less than one micrometer. Actually, the average diameter can be adjusted according to the species of the nanospheres and the actual demand of the application.

After the multiple layers of nanospheres 14 are formed on the P-type substrate 11, a volatile acetone solution 15 is poured into the container 13. Owing to the volatile solvent such as acetone, the molding solution 12 evaporates out. The P-type substrate 11 with multiple layers of nanospheres 14 on its surface is taken out of the container 13 for further application.

Figure 2:
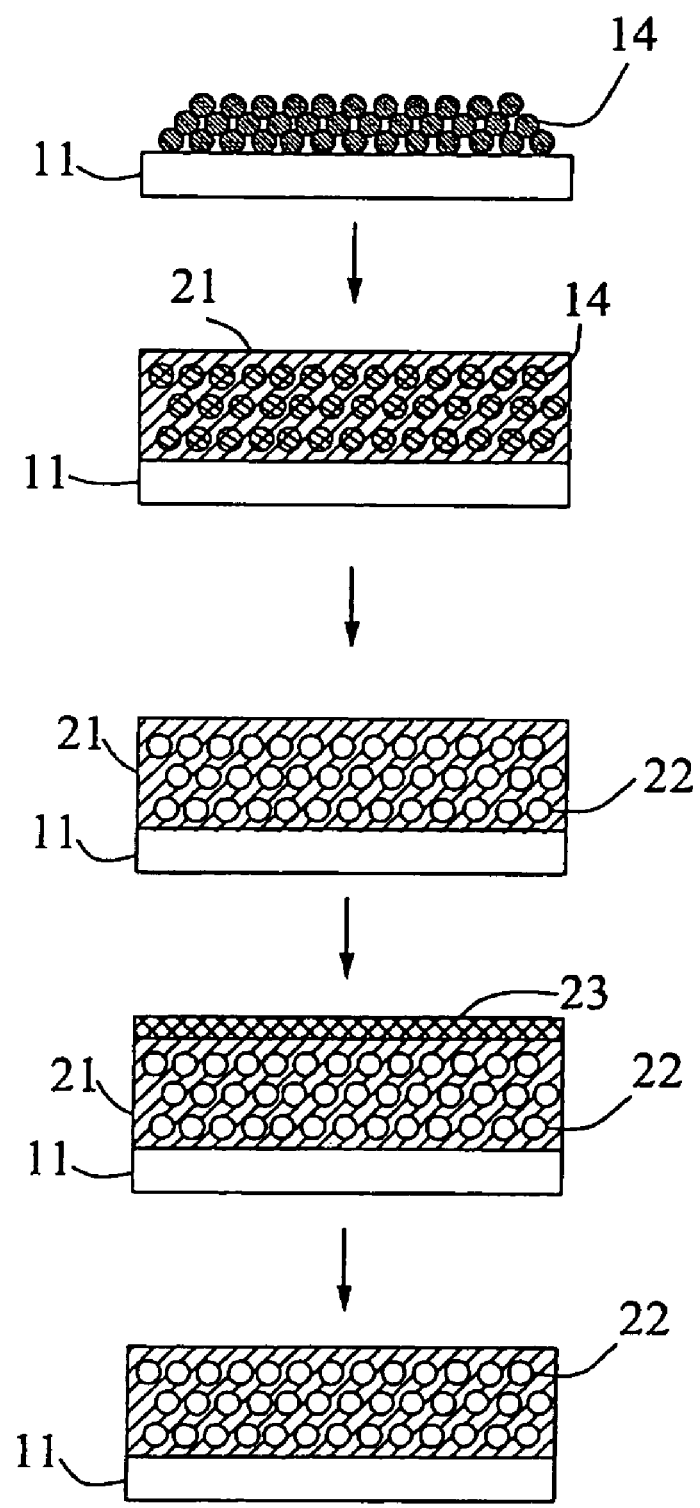
FIG. 2 is a figure showing the method of forming an active layer having plural micro cavities according to the first preferred embodiment of the present invention.

The preparation of the active layer having plural micro cavities of the present embodiment is achieved through the following steps. With reference to FIG. 2, a silicon active layer 21 is formed on the multiple layers of nanospheres through metal organic chemical vapor deposition (MOCVD). As shown in FIG. 2, the formed silicon active layer 21 covers the multiple layers of nanospheres 14 and part of the surface of the P-type substrate 11. The P-type substrate 11 and the formed silicon active layer 21 are then annealed at a temperature in a range from 700 to 900° C. The annealing process will help the single crystal silicon of the silicon active layer 21 rearranges in order. Later, the annealed silicon active layer 21 and the P-type substrate 11 are immersed in a hydrofluoric acid solution (not shown) to remove the nanospheres 14 in the silicon active layer 21. Thus, an active layer 21 having plural micro cavities 22 can be made. Even though the etching solution for removing the nanospheres 14 is hydrofluoric acid solution in the present embodiment, the etching solution for removing the nanospheres 14 is not limited, and it can be other solutions according to the materials of the nanospheres. For example, the etching solution for removing the nanospheres 14 can be formic acid if the nanospheres are PMMA nanospheres. Likewise, the etching solution for removing the nanospheres 14 can be butanone or toluene if the nanospheres are polystyrene (PS) nanospheres.

Then, a thin doping layer of gallium 23 is formed on the silicon active layer 21 having plural micro cavities 22 through vapor deposition. The formed thin doping layer 23 is then annealed to let the gallium diffuse into the silicon active layer 21. Hence, the silicon active layer 21 is transferred into a N-type silicon layer with plural micro cavities.

Figure 3:
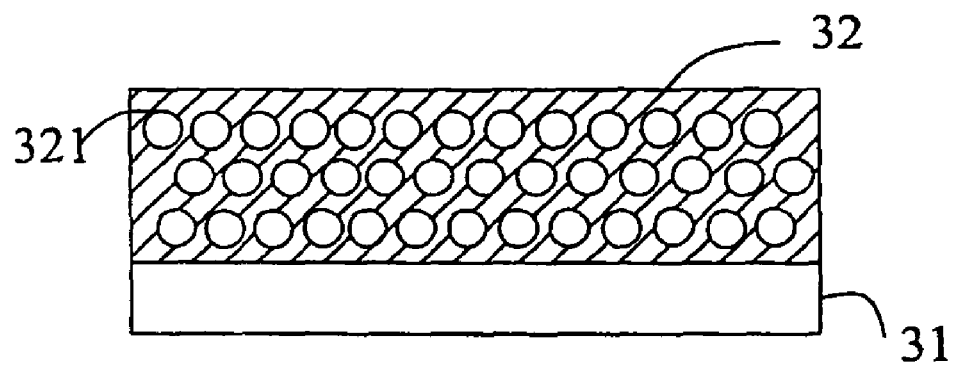
FIG. 3 is a cross-sectional view of the electrode for a solar cell according to the second preferred embodiment of the present invention.

FIG. 3 shows an electrode of a solar cell according to the second preferred embodiment of the invention, where the electrode includes the active layer of the first preferred embodiment of the present invention. In the present embodiment, the substrate 31 is a transparent indium tin oxide glass. The active layer 32 on the surface of the substrate 31 has plural micro cavities 321. The diameters of the micro cavities 321 are in a range from 150 nm to 450 nm. However, the material of the active layer can be a silicon, or doped silicon. In the present embodiment, the active layer is made of N-type single crystal silicon through the method described in the first preferred embodiment of the present invention. In addition, if the substrate 31 of an electrode of a solar cell is a P-type silicon substrate, the active layer 32 is gallium arsenide. On the other hand, if the substrate 31 of an electrode of a solar cell is a N-type silicon substrate, the active layer 32 is cadmium selenide.

Figure 4:
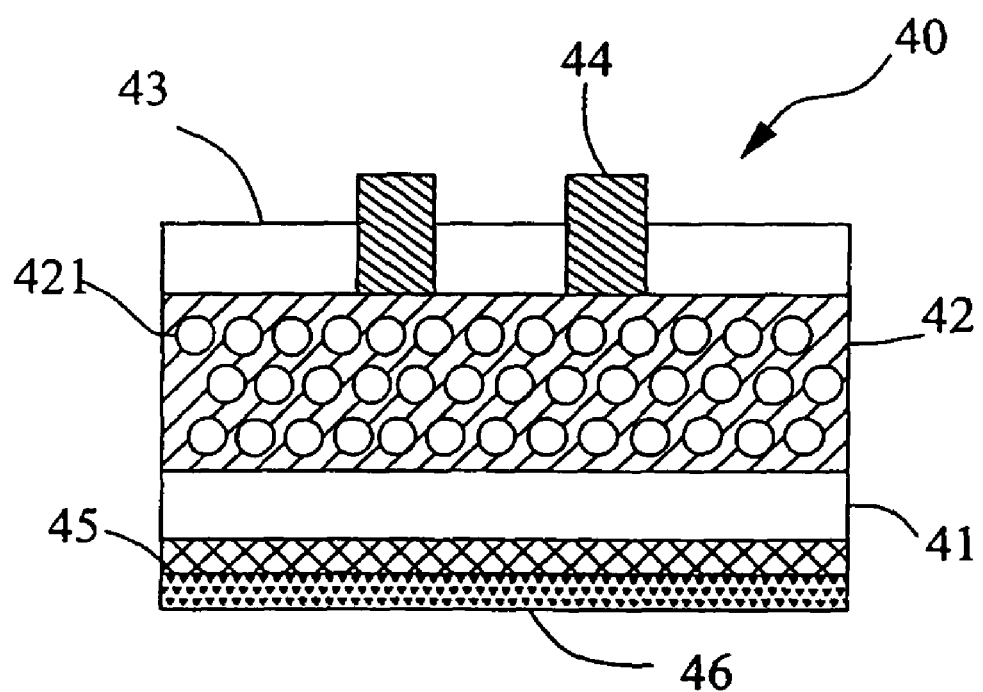
FIG. 4 is a cross-sectional view of the solar cell according to the third preferred embodiment of the present invention.

FIG. 4 is a cross-sectional view of the solar cell of the present invention according to the third preferred embodiment of the present invention. The solar cell 40 of the third preferred embodiment of the present invention is adapted to an external circuit (not shown). The solar cell 40 converts the photo energy into electrical energy and output the converted electrical energy to the external circuit (not shown). The solar cells includes the electrode (i.e. the P-type silicon substrate 41, the active layer 42 made of N-type single crystal silicon, and the micro cavities 421 in the active layer 42), a transparent top-passivation 43 locating on the surface of the active layer 42, two front contact pads 44, a back contact pad 46, and a bottom-passivation 45 locating between the P-type substrate 41 and the back contact pad 46. In the present embodiment, the transparent top-passivation 43 is glass. The bottom-passivation 45 is made of silicon oxide. Besides, the two front contact pads 44 of the present embodiment are made of silver, and are electrically connected to the active layer 42. The back contact pad 46 of the present embodiment is made of silver and is electrically connected to the P-type silicon substrate 41.

As the photons of the incident light passed the transparent top-passivation 43 and enter the solar cell 40, the photons impact the active layer 42 and the P-type-silicon substrate 41 back and forth. Therefore, multiple electrons and multiple holes generate in a form of hole-electro pair. Then, the holes locating in the N-type single crystal silicon of the active layer 42 move toward the P-type silicon substrate 41. The electrons locating in the P-type silicon substrate 41 move toward the active layer 42 made of N-type single silicon. Therefore, the moving holes and the moving electrons pass through the front contact pad or the back contact pad to enter an external circuit (not shown) to form an electrical current. At this point, the photoelectric conversion can be achieved in the solar cell of the present embodiment through the interaction illustrated above.

Although the present invention has been explained in relation to its preferred embodiment, it is to be understood that many other possible modifications and variations can be made without departing from the spirit and scope of the invention as hereinafter claimed.

What is claimed is:

1. A method for forming an active layer having plural micro cavities, comprising following steps:
   A. providing a substrate having multiple layers of nanospheres, wherein the multiple layers are formed by aggregated nanospheres;
   B. forming at least one silicon active layer to fill inter-gaps between the aggregated nanospheres and part of the surface of the substrate; and
   C. removing the nanospheres to form the active layer having plural micro cavities on the surface of the substrate.

2. The method as claimed in claim 1, wherein the substrate having multiple layers of nanospheres is prepared through following steps:
   (A1) providing a substrate, and a molding-solution comprising nanospheres and a surfactant;
   (A2) laying the substrate in the molding-solution to let the molding-solution cover at least part of a surface of the substrate; and
   (A3) adding a volatile solution or a volatile solvent to the molding-solution to remove the surfactant, and form the multiple layers of aggregated nanospheres on the surface of the substrate.

3. The method as claimed in claim 1, further comprising step (B1) annealing the silicon active layer after the silicon active layer is formed in step (B).

4. The method as claimed in claim 1, wherein the substrate is made of single crystal silicon, poly silicon, amorphous silicon, gallium arsenide, indium phosphide, gallium indium phosphide, or copper indium selenide.

5. The method as claimed in claim 1, wherein the nanospheres are made of silicon oxide.

6. The method as claimed in claim 1, wherein the silicon active layer is formed to fill an inter-gap between the nanospheres and part of the surface of the substrate through metal organic chemical vapor deposition.

7. The method as claimed in claim 1, wherein the silicon active layer is a single crystal silicon layer.

8. The method as claimed in claim 1, wherein the nanospheres are removed by hydrofluoric acid.

9. The method as claimed in claim 1, further comprising step (D) forming at least one thin doping layer on the active layer after the active layer having plural micro cavities is formed in step (C).

10. The method as claimed in claim 9, wherein the thin doping layer is formed on the surface of the silicon active layer by vapor deposition.

11. The method as claimed in claim 9, wherein the substrate is P-type silicon substrate, and the thin doping layer is made of phosphine.

12. The method as claimed in claim 9, wherein the substrate is N-type silicon substrate, and the thin doping layer is made of magnesium.

13. The method as claimed in claim 9, further comprising step (E) annealing the thin doping layer, the active layer, and the substrate after the thin doping layer is formed on the active layer in step (D).

* * * * *